United States Patent [19]
Walker et al.

[11] Patent Number: 5,933,386
[45] Date of Patent: Aug. 3, 1999

[54] DRIVING MEMORY BITLINES USING BOOSTED VOLTAGE

[75] Inventors: Robert Walker, Rougemont; Stephen Camacho, Durham, both of N.C.; Tim Lao, San Jose, Calif.

[73] Assignee: Mitsubishi Semiconductor America, Inc., Durham, N.C.

[21] Appl. No.: 08/997,509

[22] Filed: Dec. 23, 1997

[51] Int. Cl.⁶ .................................................. G11C 8/00
[52] U.S. Cl. ................ 365/230.01; 365/230.08; 365/230.06; 365/185.23
[58] Field of Search ............................ 365/226, 230.06, 365/230.01, 194, 149, 185.23, 189.11, 230.08

[56] References Cited

U.S. PATENT DOCUMENTS

| | | |
|---|---|---|
| 4,712,193 | 12/1987 | Baskett . |
| 4,829,197 | 5/1989 | Tisinger . |
| 4,910,714 | 3/1990 | Hartgring . |
| 5,050,125 | 9/1991 | Momodomi et al. . |
| 5,128,560 | 7/1992 | Chern et al. . |
| 5,187,397 | 2/1993 | Nishimori et al. . |
| 5,202,855 | 4/1993 | Morton ................................... 365/226 |
| 5,255,240 | 10/1993 | Wong . |
| 5,499,218 | 3/1996 | Ahn et al. . |
| 5,504,711 | 4/1996 | Lu . |
| 5,534,797 | 7/1996 | McPartland . |
| 5,563,823 | 10/1996 | Yiu et al. . |
| 5,570,312 | 10/1996 | Fu . |
| 5,587,958 | 12/1996 | Kaneko et al. . |
| 5,587,960 | 12/1996 | Ferris . |
| 5,699,313 | 12/1997 | Foss et al. ............................... 365/226 |
| 5,774,405 | 6/1998 | Tomishima ............................... 365/226 |

*Primary Examiner*—David Nelms
*Assistant Examiner*—Thong Le
*Attorney, Agent, or Firm*—McDermott, Will & Emery

[57] ABSTRACT

An apparatus for driving a bitline driver of a memory array is disclosed. The memory array has row lines, complementary pairs of bitlines driven by bitline drivers, and memory cells at the intersections of the bitlines and the row lines. First and second complementary write data lines provide a bit to be written to the driver and a complement of the bit. A source of a boosted voltage is coupled to a level shifter that conducts the boosted voltage to the bitline driver when the write enable line and the first write data line are asserted. The data bit is latched through a bistable latch to the bitline driver when the write enable line is asserted. A method of driving a bitline of a memory array involves receiving a data bit to be written to the bitline and a complement of the data bit; boosting one of the data bits to a voltage of a magnitude greater than a supply voltage of the memory array; and driving the data bit to a bitline driver.

15 Claims, 5 Drawing Sheets

*Figure 1A*

(PRIOR ART)

DRIVING MEMORY BITLINES USING BOOSTED VOLTAGE

FIELD OF THE INVENTION

The present invention relates to semiconductor integrated circuits, and more particularly, to driving bit write lines (bitlines) of a semiconductor memory using a boosted voltage to shorten the switching time of the bitlines. The invention has particular applicability to dynamic random access memory (DRAM) devices.

BACKGROUND OF THE INVENTION

Increasing memory access speed is a key goal in the design of computer systems. Unfortunately, the switching speed and access speed of electronic memory devices have not kept pace with increases in the speed of central processing units (CPUs) that depend on such memory devices. When executing a program involving frequent memory transfers, a faster processor coupled to a slower memory inevitably must wait while the memory completes a read or write operation. As a result, memory cycle speed or frequency has become a serious bottleneck that is limiting the development of faster computer systems.

Within a memory device, certain components are principally responsible for limiting the switching time of the device. Both of the two major types of memory devices, DRAMs and static random access memory (SRAM) devices, have an array of memory cells and circuits for driving or writing the memory cells in a controlled way.

DRAM memory cells must be periodically refreshed to maintain the state recorded in the cells. A plurality of refresh circuits are provided, each of which is associated with a column and coupled to all the memory cells in that column. A refresh signal clocks the refresh circuits and triggers them to refresh the bitlines of the column associated with the refresh circuit.

Figure 1A:
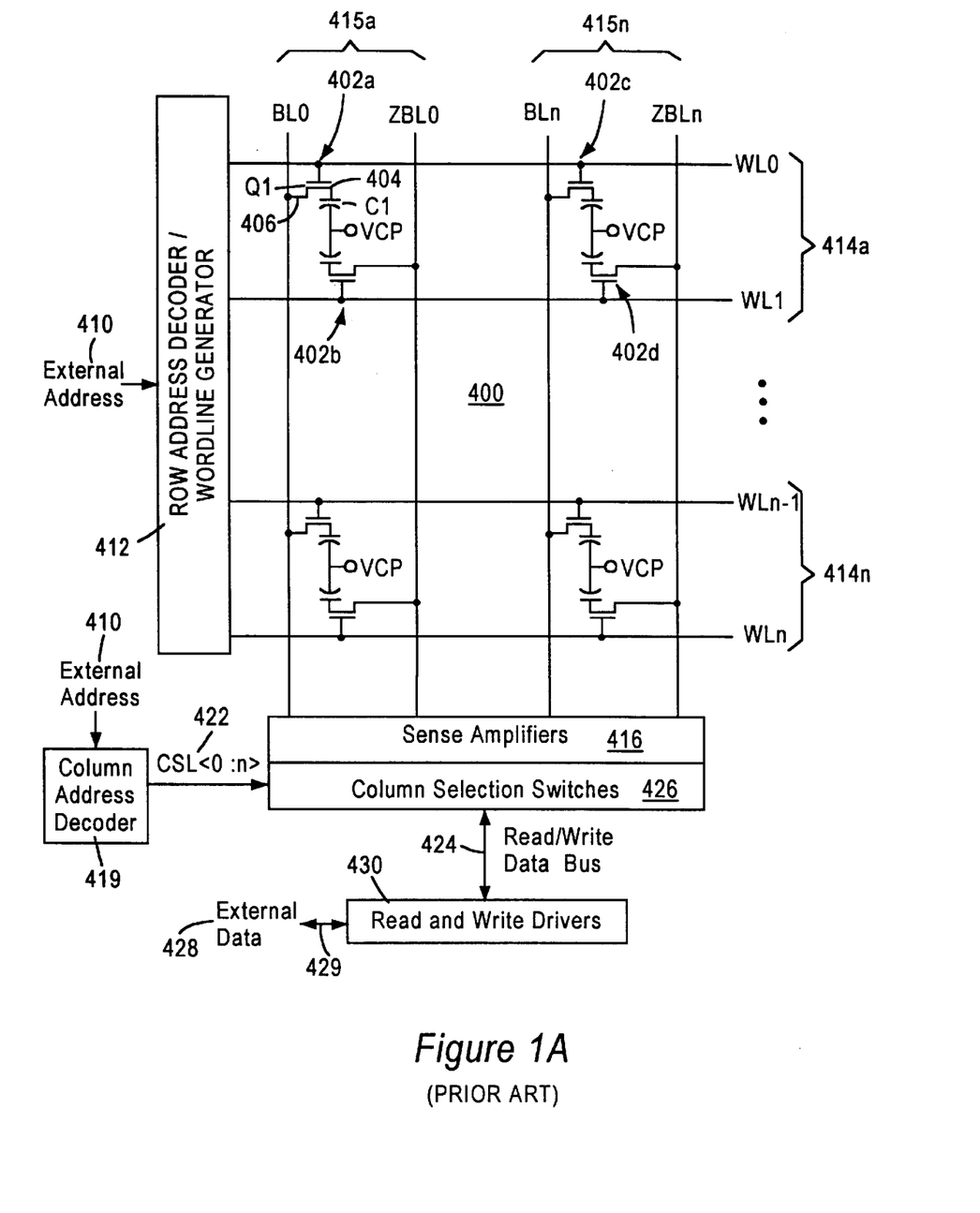
FIG. 1A is a block diagram of a DRAM circuit of the prior art.
Figure 1B:
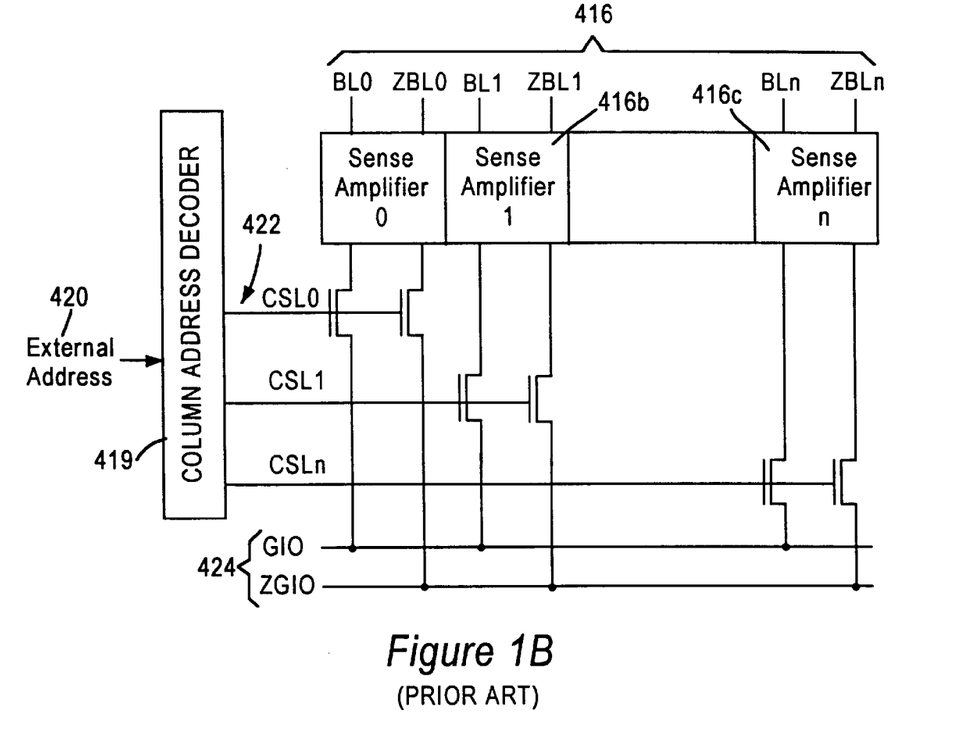
FIG. 1B is a block diagram of a portion of the circuit of FIG. 1A.
Figure 1C:
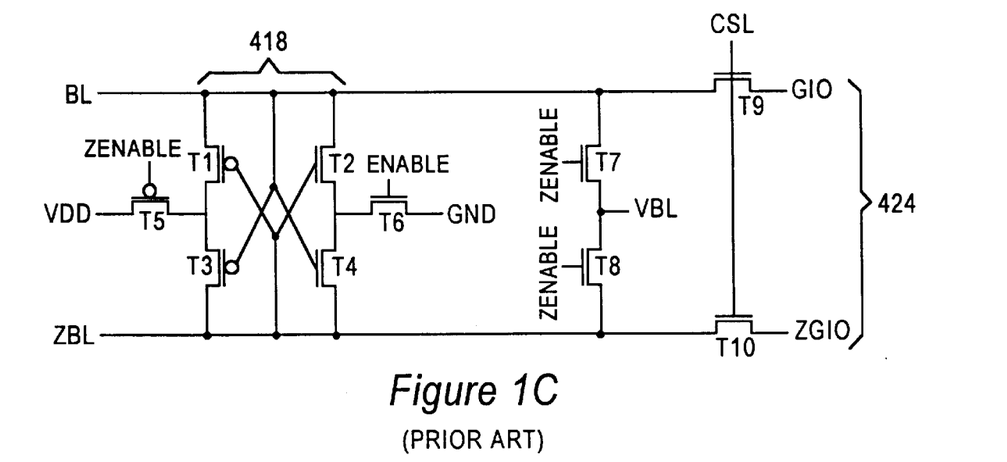
FIG. 1C is a block diagram of another portion of the circuit of FIG. 1A.

FIG. 1A is a block diagram of a (n×n×1 bit) DRAM device 400. FIGS. 1B and 1C are block diagrams of portions of the device 400 of FIG. 1A. The DRAM device 400 comprises an array of memory cells 402a, 402b, 402c, 402d. Each memory cell 402a–402d consists of a memory pass transistor Q1 and a capacitor C1. One side of the capacitor C1 is connected to a cell plate voltage, denoted VCP. VCP has a constant value, and is typically generated on the DRAM device 400. The other side of the capacitor C1 is connected to the source terminal 404 of the memory pass transistor Q1. A wordline WL is coupled to the gate of the memory pass transistor Q1 and its drain 406 is coupled to one of two complementary bitlines BL, ZBL. Multiple memory pass transistors Q1 of different memory cells 402a–402d are connected to each bitline BL, ZBL, and each memory pass transistor Q1 is selected by a different wordline from among wordlines WL0 through WLn.

The memory cells 402a–402d are organized into a plurality of rows 414a through 414n. The memory cells 402a–402d also are organized into a plurality of columns 415a through 415n.

An external address 410 supplied on an address bus is coupled to a row address decoder/wordline generator 412, which is coupled to the wordlines WL0 through WLn. The external address 410 is also supplied over the address bus to a column address decoder 419.

Referring now to both FIG. 1A and FIG. 1B, column select lines 422 coupled the column address decoder 419 to column selection switches 426. A plurality of sense amplifiers 416a–416n, represented in FIG. 1A as a block of sense amplifiers 416, receive column select signals from the column selection switches 426. Each of the sense amplifiers 416 is coupled to bitlines BL0, ZBL0 of one of the columns 415a–415n. The sense amplifiers 416 are enabled and disabled using the ENABLE (logic high) and ZENABLE (logic low) signals shown in FIG. 1C.

External data 428 that is to be read from or written to the DRAM device 400 is supplied on a device data bus 429 to a plurality of read and write drivers 430. The read and write drivers 430 supply the data 428 to the column selection switches via a read/write data bus 424.

To read or write external data 428 to a memory cell 402a–402d located in one of the columns 415a–415n, a series of steps are carried out. First, the array of memory cells 402a–402d is "pre-charged." In the pre-charge state, each bitline BL, ZBL is driven to a potential of VBL through transistors T7 and T8 of the circuit shown in FIG. 1C. In other words, the potential of each pair of bitlines BL, ZBL is equalized.

The location of the memory cell 402a–402d that is to be written is identified by supplying an external address 410 to the DRAM device 400. The external address 410 is fed to a row address decoder/wordline generator 412, which decodes the external address into a row address. The row address decoder/wordline generator 412 also identifies and activates one of the wordlines 414a, 414n that corresponds to the row of the selected memory cell 402a–402d. Thus, applying an external address to the DRAM device 400 activates one of the wordlines.

When a wordline is asserted by the row address decoder/wordline generator 412, a small amount of charge is added to or removed from a bitline BL or ZBL, depending upon the connection of the selected memory pass gate Q1.

When one of the sense amplifiers 416 is enabled, by asserting the ENABLE line, equalization transistors T7 and T8 turn off, and a cross-coupled latch 418 consisting of T1 through T4 is enabled. Since a small amount of charge has been added/removed from one of the bitlines BL or ZBL, each of the bitlines BL and ZBL now have a slightly different potential. The cross-coupled latch 418 senses this small difference in potential. In response, the cross-coupled latch 418 drives one of the bitlines BL, ZBL to full $V_{DD}$ and the other bitline to ground (GND). Then data can be read from or written to one of the columns 415a, 415n. Such operations are collectively called "column operations".

As shown in FIG. 1B, when a column operation is initiated, a column address decoder 419 decodes the column address 420 into one of the column select lines (CSL) 422. The line selected from among the column select lines 422 connects one of the sense amplifiers 416a, 416b, 416c to a global bus 424 that comprises two lines designated Global Input/Output (GIO) and its complement ZGIO. For a read operation, data is read from the global bus 424 by a read amplifier.

In a write operation, complementary data is driven onto the lines GIO and ZGIO of the global bus 424 by a write driver, and the data in one of the sense amplifiers, such as sense amplifier 416a, is overwritten. That is, after the write operation the sense amplifier 416a and the memory cell 402a–402n connected to it by a memory pass transistor Q1 retains the data presented during the write operation.

The voltage differential between GIO and ZGIO is a prime factor in how fast the sense amplifier 416a can be overwritten by the data driven onto the global bus 424 by the write driver. Generally, the larger the differential, the faster the sense amplifier data will be overwritten.

Although FIG. 1A, FIG. 1B, and FIG. 1C show structure for a 1-bit architecture, the structure shown in the figures and the operational concepts described above may be used with an architecture having a width of any number of bits.

Figure 1D:
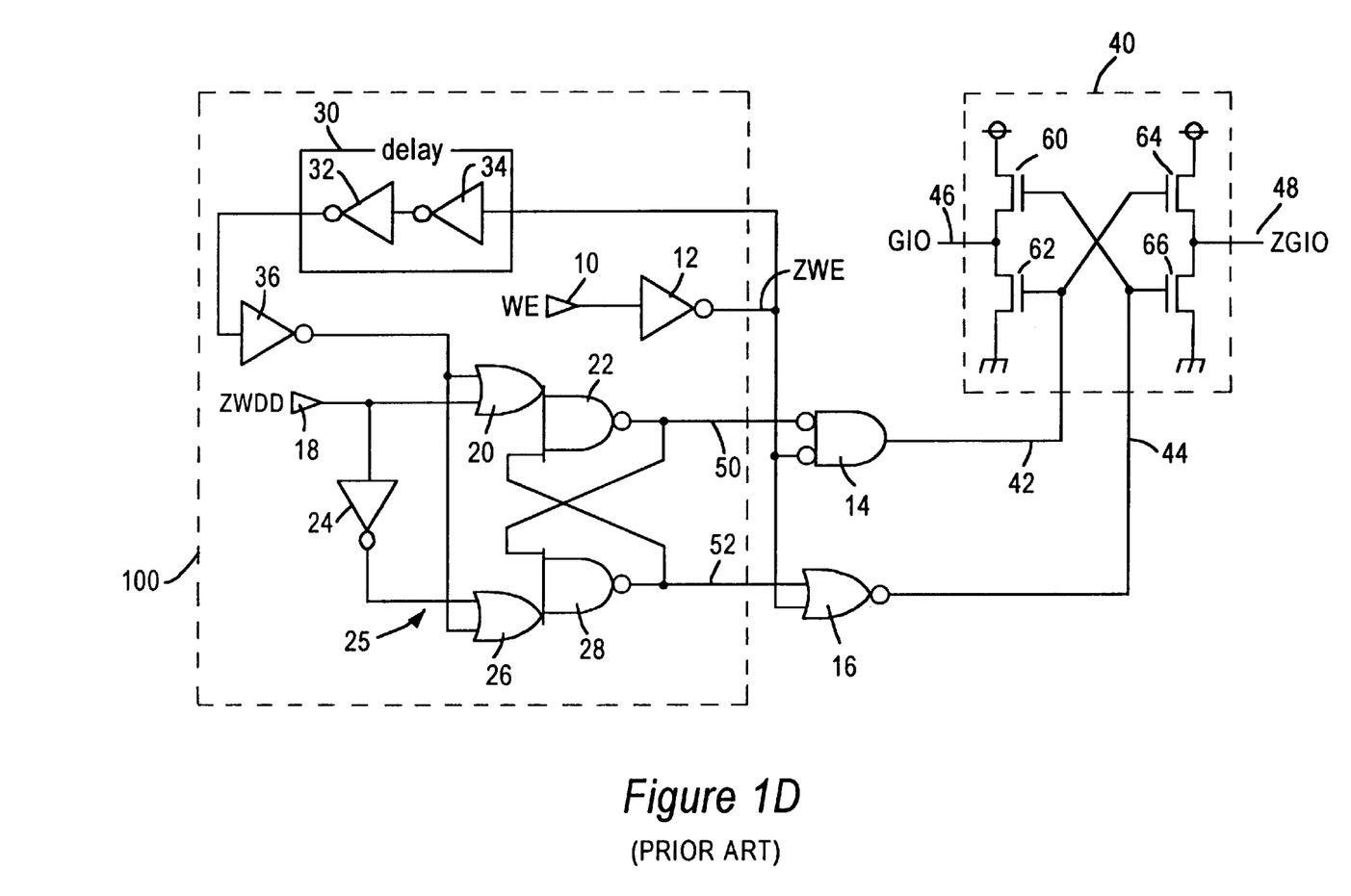
FIG. 1D is a schematic diagram of a memory bitline driver circuit of the prior art.

One prior memory circuit with a bitline driver circuit is shown in FIG. 1D. A data driver circuit 100 accepts a write enable (WE) signal 10 and a complement write data (ZWDD) signal 18 as inputs, and drives a bitline driver circuit 40. The bitline driver circuit 40 drives two complementary bitlines GIO and ZGIO that are connected to each cell in an array of memory cells. The designations GIO and ZGIO refer to the role of the bitlines as global input/output lines for the memory cells.

The WE signal 10 is fed to an inverter 12 that produces a complementary signal ZWE as its output and feeds a first input of a NOR gate 14 and a first input of a NOR gate 16. The ZWE signal also is fed to a delay circuit 30, comprising two series coupled inverters 32, 34. The delay circuit 30 is used to adjust signal timing so that the ZWE signal appears at a latch 25, described below, at the correct instant.

The ZWE signal is then inverted again through inverter 36 and provided as the enable signal to a bistable latch 25 formed by OR gate 20, NAND gate 22, OR gate 26, and NAND gate 28. The write data signal ZWDD 18 is coupled to the latch, in conventional fashion, directly to the OR gate 20 and through an inverter 24 to one input of the OR gate 26. As is conventional, when the WE signal is pulled high, the current ZWDD data is latched by latch 25 and the outputs 50, 52 will remain the same until WE is pulled low.

The output 50 of the latch 25 is coupled along with the ZWE signal at the inputs of a NOR gate 14. The complementary latch output 52 is similarly coupled along with ZWE at the inputs of a NOR gate 16. The output 42 of the NOR gate 14 and the output 44 of the NOR gate 16 are coupled to a bitline driver circuit 40. The bitline driver circuit 40 comprises a pair of low bit drive transistors 60, 62 each having its gate cross-coupled to a gate of a second pair of high bit drive transistors 64, 66. The source terminals of a first transistor in each pair, i.e., the transistors 60, 64, are coupled to the supply voltage $V_{DD}$. The source terminals of the second transistor in each pair, i.e., the transistors 62, 66, are coupled to ground. The drain terminal of the first transistor in a pair is coupled to the drain terminal of the second transistor in each pair and to one of the bitlines 46, 48. As shown, the drain of transistor 60 is coupled to the drain of transistor 62 and to the GIO bitline 46. The drain of transistor 64 is coupled to the drain of transistor 66 and to the ZGIO bitline 48. In this configuration, the transistor pairs will conduct either $V_{DD}$ minus a transistor voltage drop, $V_T$, or ground to the bitlines depending on the logic state of the outputs 42, 44. Thus, the outputs 42, 44 drive the complementary bitlines GIO 46 and ZGIO 48.

The circuit of FIG. 1D can be implemented in a metal oxide semiconductor (MOS) integrated circuit using known fabrication techniques.

In operation, to write data to the bitlines, a data bit is sent or fed to the write data line ZWDD and the WE line is pulled high. When WE is high, latch 25 latches the data at ZWDD. The NOR gate 14 and the NOR gate 16 then produce complementary outputs 42, 44. If ZWDD is has a value that is logic low, or zero, then a one is being written. In this case, low logic values are presented to both inputs of the NOR gate 16, yielding a high or one at its output 44. When the output 44 is high, cross-coupled transistors 60, 66 conduct, thereby conducting $V_{DD}-V_T$ to the GIO line 46 and pulling the ZGIO line 48 to ground, which is consistent with writing a one to the GIO bitline 46. In contrast, if ZWDD is high, then the cross-coupled transistors will conduct in opposite states, so that a zero is written to the bitlines. Thus, when WE is pulled high, either a logic high level voltage of $V_{DD}-V_T$ or ground will appear at each of ZGIO and GIO, depending on whether the value of ZWDD is high or low.

Although this approach produces complementary signals for driving a memory cell according to data that is to be written to the cell, this circuit has a significant disadvantage. The circuit in FIG. 1D can only supply a maximum voltage differential between GIO and ZGIO of $V_{DD}-V_T$. The differential voltage between GIO and ZGIO directly relates to how fast the memory device can be written. As a result, the circuit of FIG. 1D will limit the switching frequency of a memory device in which it is used, creating a bottleneck.

SUMMARY OF THE INVENTION

In view of the limitations associated with existing approaches for driving bitlines of memory devices, there is a need for an arrangement to drive bitlines of a memory device so that the bitlines switch more rapidly.

There is also a need for a way to drive complementary bitlines more rapidly based upon a single data bit to be written and an enable signal.

These and other needs are attained by the present invention, wherein an apparatus for driving a bitline driver of a memory device is provided, comprising a first write data line for carrying a data bit to be supplied to the bitline driver; a source of a boosted voltage; and means coupled to the first write data line and the boosted voltage source for driving the data bit to the bitline driver at the boosted voltage. In one aspect of the invention, the means for driving comprises a level shifter.

In another aspect, the level shifter comprises means, coupled to a write enable line, for supplying the boosted voltage to the bitline driver when the write enable line and the first write data line are asserted. In one embodiment, the level shifter is a first transistor coupled to the first write data line; a second transistor coupled to the write enable line and to the first transistor; and a third transistor coupled to the boost voltage and to the second transistor. In this combination, when the first write data line and the write enable line are asserted, the first, second and third transistors are controlled to conduct so that the boost voltage is supplied to the bitline driver. In one embodiment, the third transistor is p-channel device.

In another embodiment, the apparatus also has a bistable latch coupled to the first data line and to a write enable line. The data bit is latched to the means for driving when the write enable line is asserted. In one aspect, the bistable latch has first and second complementary write data outputs that are coupled to the means for driving. The means for driving has means for driving each of the first and second complementary write data outputs to the bitline driver at a level of the boosted voltage.

In yet another aspect, the bitline driver has first and second complementary drive input lines; first and second pairs of drive transistors each coupled to the first and second complementary drive input lines; and first and second complementary bitlines coupled to and driven by one of the first and second pairs of drive transistors.

In another aspect, the invention provides a memory array having a plurality of row lines, a plurality of bitline drivers that each generate complementary bitline signals on a pair of complementary bitlines, and memory cells coupled to the row lines at intersections thereof. The memory array comprises a first write data line for receiving a data bit to be written to the bitline driver; a second write data line providing a signal complementary to the data bit on the first write data line; a source of a boosted voltage; and means coupled to the first write data line, the second write data line, and the boosted voltage source for driving the data bit to the bitline driver at the boosted voltage. In one embodiment, the means for driving is first and second complementary level shifters coupled respectively to the first and second write data lines. In another aspect, the bitline driver comprises first and second complementary drive input lines; first and second pairs of drive transistors coupled respectively to the first and second complementary drive input lines; and first and second complementary bitlines coupled to and driven by one of the first and second pairs of drive transistors.

The invention also encompasses a method of driving a bitline of a memory device, comprising the steps of receiving a first data bit to be written to the bitline and a second data bit that is a complement of the second data bit; boosting one of the data bits to attain a boosted voltage of a magnitude greater than a supply voltage of the memory device; and driving the data bit that is boosted to a bitline driver coupled to the bitline at the level of the boosted voltage.

In one aspect, receiving the first data bit involves the steps of receiving a write enable signal indicate that the first data bit is to be written. The step of boosting one of the data bits is carried out in response to the write enable signal. In another aspect, the step of receiving a first data bit includes the step of receiving the first data bit at a bistable latch coupled to a write enable line. In yet another aspect, the method also comprises the step of latching the first data bit when the write enable line is asserted.

Additional advantages and novel features of the invention will be set forth in part in the description that follows. The advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF THE PREFERRED EMBODIMENT

Figures 2A, 2B:
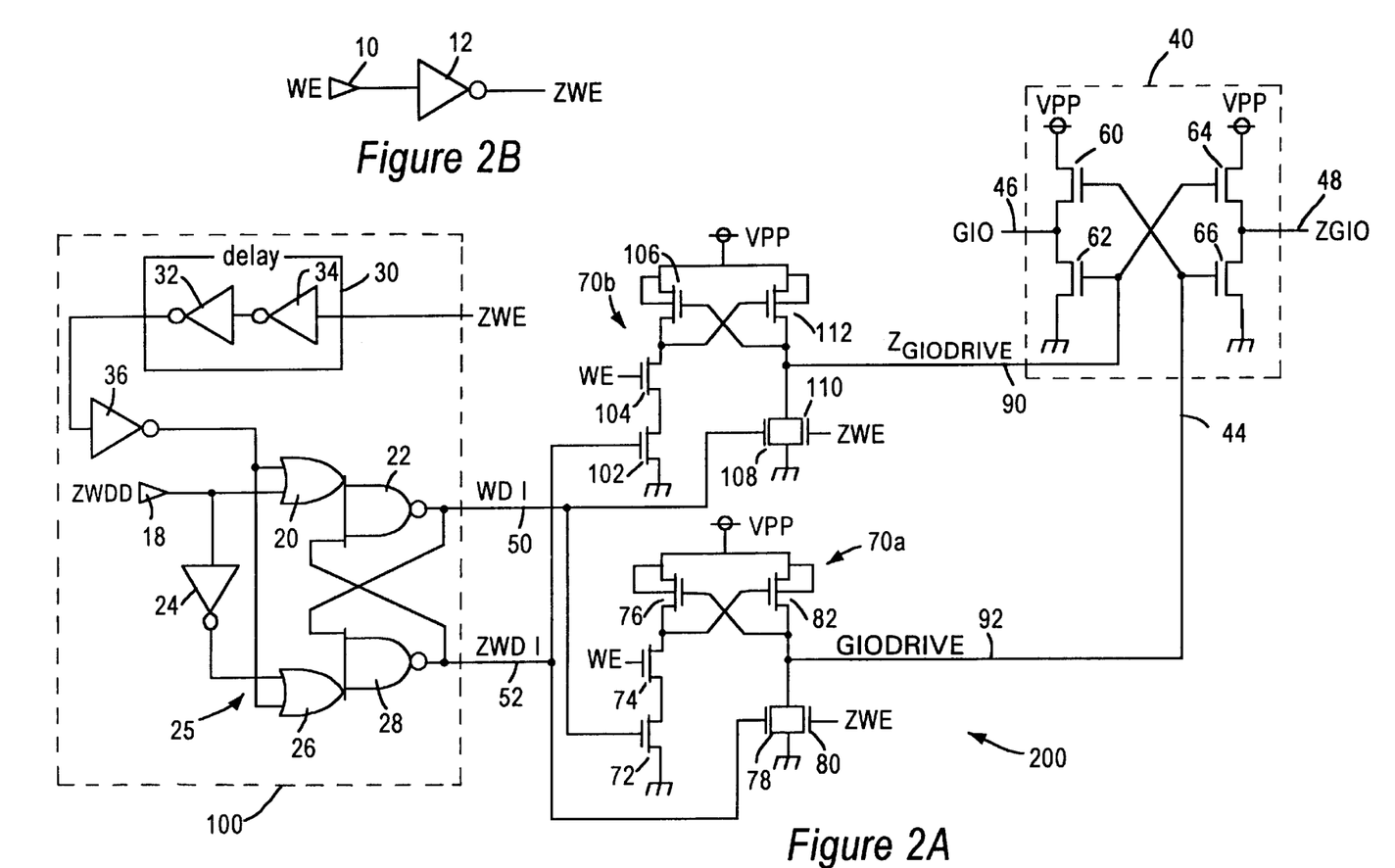
FIGS. 2A and 2B are schematic diagrams of an apparatus for driving memory bitlines according to an embodiment of the present invention.

FIGS. 2A and 2B are schematic diagrams of an exemplary boosted voltage driver circuit 200 according to a first embodiment of the present invention.

Reference numeral 100 indicates the data driver circuit described above and having the same components as shown in FIG. 1D. Its output lines 50, 52 are designated as write data lines using the abbreviations WD_L and ZWD_L, respectively. The driver circuit 200 includes a bitline driver circuit 40 having the same components as shown in FIG. 1D. The driver circuit 200 receives both the write enable signal WE and its complement, ZWE, as inputs. As shown in FIG. 2B, the ZWE signal is obtained by coupling the WE signal 10 to an inverter 12; the ZWE signal appears at the output of the inverter 12.

The WD_L and ZWD_L lines 50, 52 are coupled as inputs to complementary first and second level shifter circuits 70a, 70b. The level shifter circuits 70a, 70b produce complementary outputs 92, 90 respectively to drive the bitline driver circuit 40.

The first level shifter circuit 70a comprises six transistors 72, 74, 76, 78, 80, 82. The WD_L line is coupled to the gate of the first transistor 72. Its drain is coupled to ground and its source is coupled to the drain terminal of the second transistor 74. The WE signal is coupled to the gate of the second transistor 74, and its source terminal is coupled to the drain of the third transistor 76 and is cross-coupled to the gate of the sixth transistor 82. The gate of the third transistor 76 is cross-coupled to the drain of the sixth transistor 82. This connection is also coupled to the source terminals of both the fourth and fifth transistors 78, 80, and produced is the output signal GIODRIVE 92. The drain terminals of the fourth and fifth transistors 78, 80 are coupled to one another and to ground. The ZWD_L signal is coupled to the gate of the fourth transistor 78, and the ZWE signal is coupled to the gate of the fifth transistor 80.

The third and sixth transistors 76, 82 are p-channel devices. Their sources are coupled together and to a boost voltage $V_{PP}$ that is defined as the supply voltage $V_{DD}$ plus approximately 1.5 volts. The supply voltage $V_{DD}$ is typically about 3.3 volts. These voltage values are only exemplary, and other voltages in a wide range may be used. No particular ratio of boost voltage to supply voltage is required.

The boost voltage $V_{PP}$ also is coupled to the source terminals of the transistors 60, 64 of the bitline driver circuit 40.

The second level shifter 70b is formed from six transistors 102, 104, 106, 108, 110, 112 that are interconnected in a manner like that described above for the first level shifter 70a. However, in the second level shifter 70b the WD_L line 50 is coupled to the gate of the fourth transistor 108 and the ZWD_L line is coupled to the gate of the third transistor 102. This enables the second level shifter 70b to provide an output signal ZGIODRIVE 90 that is complementary to the GIODRIVE signal 92.

The third and sixth transistors 106, 112 are p-channel devices. Their source terminals are coupled together and to the boost voltage $V_{PP}$.

In operation, to write data to the bitlines ZGIO and GIO, the WE line is set to a high logic level and the data to be written is placed on the ZWDD line. The data driver circuit 100 will operate generally in the manner described above with reference to FIG. 1D. Two operational states are possible depending on whether a one or a zero is being written to the memory.

When a zero is being written, through operation of the latch 25, the WD_L line will be low and the ZWD_L line will be high. The high ZWD_L signal is presented at the gate of the fourth transistor 78 of the first level shifter 70a, causing the fourth transistor 78 to turn on and pull GIO-DRIVE to ground. As a result, transistors 60 and 66 of circuit 40 turn off.

Concurrently, the first transistor 102 of the second level shifter 70b turns on. When WE is high, as it must be to write data, the second transistor 104 will turn on, so that the gate of the sixth transistor 112 conducts to ground. Accordingly, the boost voltage $V_{PP}$ is pushed to the ZGIODRIVE line by the cross-coupled sixth transistor 112. This turns on transistors 62, 64 using the boost voltage $V_{PP}$. As a result, GIO is pulled to ground and a boosted voltage is conducted to ZGIO. The boosted voltage conducted to ZGIO is the difference between the boost voltage $V_{PP}$ and a theoretical transistor voltage drop $V_T$.

When a one is to be written to the bitline driver circuit 40, WD_L is high and ZWD_L is low. This turns on the fourth transistor 108 of the second level shift circuit 70b, forcing ground to ZGIODRIVE. Accordingly, the transistors 62, 64 of the bitline driver circuit 40 turn off.

At the same time, if WE is high, as it must be to write a bit, the second transistor 74 of the first level shift circuit 70a turns on. This enables the cross-coupled third and sixth transistors 76, 82 to conduct $V_{pp}$ to GIODRIVE. As a result, transistor 66 and transistor 60 of the bitline driver circuit 40 turn on, thereby pulling ZGIO to ground and conducting the voltage ($V_{PP}-V_T$) to GIO.

Because the transistors 60, 62, 64, 66 are turned on using the boost voltage $_{PP}$, rather than the lower supply voltage $V_{DD}$, they switch states more rapidly than prior circuits. Further, driving a higher voltage onto the GIO/ZGIO bitlines increases the switching speed of the sense amplifier. Thus, during a write operation the current data in the sense amplifier can be changed to the new write data faster.

Thus, according to the present invention, switching time of memory bitlines is improved by driving data to the bitlines at a boosted voltage.

Figure 3:
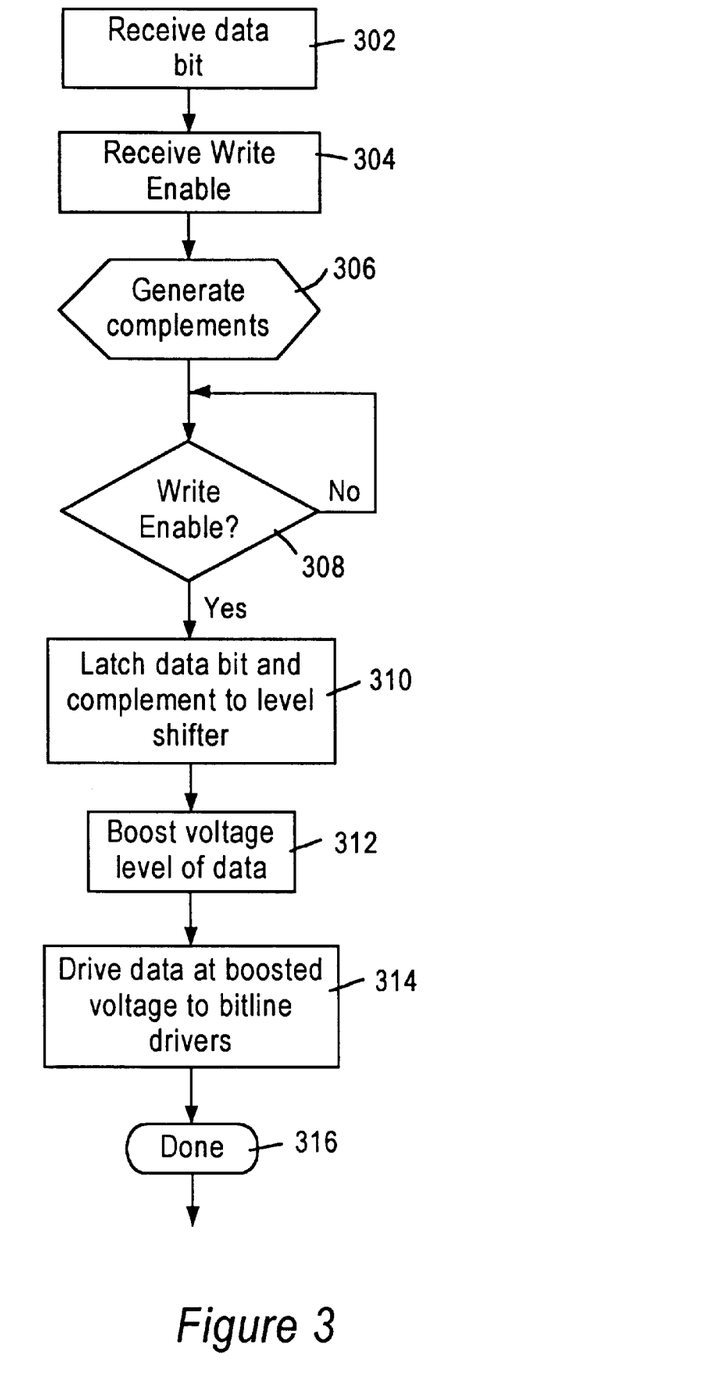
FIG. 3 is a flow diagram of a method according to the invention for driving a memory bitline using a boosted voltage.

The invention also encompasses a method of driving bitlines, one embodiment of which is shown in FIG. 3. According to this aspect of the invention, the method is initiated at step 302 by receiving a data bit, for example, by receiving a data bit on the WD line of the latch 25. In step 304, a Write Enable signal or its equivalent is received, for example, by receiving the ZWE signal in the latch 25. In step 306, complements of the data bit and the Write Enable signal are generated. The complement signals can be the ZWDD and ZWE signals that are generated by passing the WDD and WE signals through inverters.

In step 308, a test is conducted to determine whether the Write Enable signal is asserted. If so, in step 310 the data bit and its complement are moved or latched to a circuit that can increase the voltage level of the data bit and its complement, such as a level shifter. In step 312, the voltage level of the data bit and its complement are boosted. In step 314, the data bit and its complement are driven at the boosted level to a bitline driver, such as the bitline driver circuit 40. In this manner, the bitlines have been driven to change state using boosted voltage data bits. Therefore, the method concludes at step 316.

Although the disclosed embodiments have been described with respect to writing bitlines of DRAM devices, the present invention is applicable to SRAM devices, and any other device that uses any line or signal that is driven to change state. In addition, the invention can be used with a wide range of supply voltage levels and boosted voltage levels.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An apparatus for driving a bitline driver of a memory device, comprising:
    a first write data line for carrying a data bit to be supplied to said bitline driver;
    a source of a boosted voltage larger in magnitude than an operating voltage; and
    a driving circuit coupled to said first write data line and said boosted voltage source for driving said data bit to said bitline driver at a level of said boosted voltage, said driving circuit including a level shifter having a voltage supplying circuit coupled to a write enable line for supplying said boosted voltage to said bitline driver when said write enable line and said first write data line are asserted.

2. The apparatus recited in claim 1, wherein said level shifter comprises:
    a first transistor coupled to said first write data line;
    a second transistor coupled to said write enable line and to said first transistor;
    a third transistor coupled to said boost voltage and to said second transistor; and
    wherein when said first write data line and said write enable line are asserted, said first, second and third transistors are controlled to conduct so that said boost voltage is supplied to said bitline driver.

3. The apparatus recited in claim 2, wherein said third transistor is p-channel device.

4. The apparatus recited in claim 2, further comprising:
    a bistable latch coupled to said first data line and to said write enable line, wherein said data bit is latched, to said means for driving, when said write enable line is asserted.

5. The apparatus recited in claim 4, wherein:
    said bistable latch comprises first and second complementary write data outputs;
    said first and second complementary write data outputs are coupled to said means for driving; and
    said means for driving further comprises means driving each of said first and second complementary write data output to said bitline driver at a level of said boosted voltage.

6. The apparatus recited in claim 1, wherein said bitline driver comprises:
    first and second complementary drive input lines;
    first and second pairs of drive transistors each coupled to said first and second complementary drive input lines; and
    first and second complementary bitlines driven by one of said first and second pairs of drive transistors.

7. A memory array having a plurality of row lines, a plurality of bitline drivers that each generate complementary bitline signals on a pair of complementary bitlines, and memory cells coupled to said row lines and said bitlines at intersections thereof, a first write data line for receiving a data bit to be written to said bitline driver, and a second write data line providing a signal complementary to the data bit on said first write data line, the memory array comprising:
    a source of a boosted voltage; and
    driving circuit coupled to said first write data line, said second write data line, and said boosted voltage source for driving said data bit to said bitline driver at a level of said boosted voltages, said driving circuit including first and second complementary level shifters coupled respectively to said first and second write data lines, and each of said first and second level shifters including applying circuit coupled to a write enable line for applying said boosted voltage to said bitline driver when said write enable line and one of said first and second write data lines are asserted.

8. The memory array recited in claim 7, wherein said first level shifter comprises:

a first transistor coupled to said first write data line;

a second transistor coupled to said write enable line and to said first transistor; and a third transistor coupled to said boost voltage and to said second transistor;

wherein, when said first write data line and said write enable line are asserted, said first, second and third transistors conduct so that said boost voltage is supplied to said bitline driver.

9. The memory array recited in claim 8, wherein said third transistor is p-channel device.

10. The memory array recited in claim 9, further comprising:

a bistable latch coupled to said first data line and to a write enable line, wherein said data bit is latched and applied to said means for driving when said write enable line is asserted.

11. The memory array recited in claim 10, wherein:

said bistable latch comprises first and second complementary write data outputs;

said first and second complementary write data outputs are coupled to said means for driving; and said means for driving further comprises means for driving each of said first and second complementary write data outputs to said bitline driver at the level of said boosted voltage.

12. The memory array recited in claim 7, wherein said bitline driver comprises:

first and second complementary drive input lines;

first and second pairs of drive transistors coupled respectively to said first and second complementary drive input lines; and first and second complementary bitlines coupled to and driven respectively by said first and second pairs of drive transistors.

13. A method of driving a bitline of a memory device, comprising the steps of:

receiving a first data bit to be written to said bitline and a second data bit that is a complement of the first data bit;

boosting one of the data bits to attain a boosted voltage of a magnitude greater than a supply voltage of the memory device; and driving the data bit that is boosted to a bitline driver coupled to the bitline at the level of the boosted voltage.

14. The method recited in claim 13, wherein the step of receiving the first data bit further comprises the step of:

receiving a write enable signal indicating that the first data bit is to be written;

and wherein the step of boosting one of the data bits is carried out in response to the write enable signal.

15. The method recited in claim 13, wherein the step of receiving a first data bit includes the steps of:

receiving the first data bit at a bistable latch coupled to a write enable line; and latching the first data bit when the write enable line is asserted.

* * * * *